United States Patent
Getman et al.

(10) Patent No.: US 6,420,816 B2
(45) Date of Patent: Jul. 16, 2002

(54) METHOD FOR EXCITING LAMB WAVES IN A PLATE, IN PARTICULAR A CONTAINER WALL, AND AN APPARATUS FOR CARRYING OUT THE METHOD AND FOR RECEIVING THE EXCITED LAMB WAVES

(75) Inventors: Igor Getman; Sergej Lopatin; Alexander Hardell, all of Lörrach (DE)

(73) Assignee: Endress + Hauser GmbH + Co., Maulburg (DE)

( * ) Notice: Subject to any disclaimer, the term of this patent is extended or adjusted under 35 U.S.C. 154(b) by 0 days.

(21) Appl. No.: 09/730,556

(22) Filed: Dec. 7, 2000

(30) Foreign Application Priority Data

Dec. 22, 1999 (DE) .......................................... 199 61 857

(51) Int. Cl.$^7$ ............................................. H01L 41/08
(52) U.S. Cl. ............................. 310/313 R; 310/313 A; 310/313 B; 310/334
(58) Field of Search ............................ 310/313 R, 334, 310/336, 337, 321, 322, 313 A, 313 B, 313 D

(56) References Cited

U.S. PATENT DOCUMENTS

| | | | |
|---|---|---|---|
| 3,401,360 A | * 9/1968 | Schulz-Dubois | 310/334 X |
| 4,296,348 A | * 10/1981 | Toda | 310/337 X |
| 4,768,256 A | * 9/1988 | Motoda | 310/334 X |
| 4,954,997 A | 9/1990 | Dieulesaint et al. | |
| 5,129,262 A | * 7/1992 | White et al. | 310/313 R |
| 5,450,752 A | * 9/1995 | White et al. | 73/643 |
| 5,532,538 A | * 7/1996 | Jin et al. | 310/313 R |
| 5,886,452 A | * 3/1999 | Toda | 310/313 R |
| 5,910,286 A | * 6/1999 | Lipskier | 422/68.1 |
| 6,121,856 A | * 9/2000 | Apostolos | 333/141 |

OTHER PUBLICATIONS

Ultrasonic Technology, A Series of Monographs, General Editor Lewis Balamuth, Cavitron Corp., pp. 69, 70 & 82.
Vallekoop, Michael J.: Acoustic Wave Sensors and Their Technology, In: Ultrasonics 36, 1998, pp. 7–14.

* cited by examiner

Primary Examiner—Mark O. Budd
(74) Attorney, Agent, or Firm—Jones, Tullar & Cooper, P.C.

(57) ABSTRACT

In order to excite Lamb waves in a plate or container wall, an IDT transducer (interdigital transducer) is employed. The IDT comprises a layer composed of piezoelectric material, and on one of whose surfaces two electrodes which engage in one another like fingers are applied. The IDT is acoustically coupled to the plate or container wall by means of the surface facing away from the electrodes. If a radio-frequency AC voltage is applied to the connections of the electrodes, then a thickness vibration is initiated in the piezoelectric layer. If the speed of propagation or speed of sound of the longitudinal waves which result in this thickness vibration in the piezoelectric layer is matched to the phase velocity with which a $s_0$ mode Lamb wave propagates in the material of the plate or of the container wall then only $s_0$ mode Lamb waves are initiated by the resonance effect in the plate or container wall, by virtue of the acoustic coupling between the piezoelectric layer and the plate or container wall. The matching process can be carried out by selecting the distance (D) between the fingers of the electrodes such that this distance (D) is equal to half the wavelength $\lambda/2$ of the thickness vibration to be initiated in the piezoelectric layer.

7 Claims, 2 Drawing Sheets

METHOD FOR EXCITING LAMB WAVES IN A PLATE, IN PARTICULAR A CONTAINER WALL, AND AN APPARATUS FOR CARRYING OUT THE METHOD AND FOR RECEIVING THE EXCITED LAMB WAVES

FIELD OF THE INVENTION

The present invention relates to a method for exciting Lamb waves in a plate, in particular a container wall, and an apparatus for carrying out the method and for receiving the excited Lamb waves.

BACKGROUND OF THE INVENTION

The use of Lamb waves in level measurement devices is known per se. The Lamb waves caused in a container wall by a Lamb wave exciter In the form of an electroacoustic transducer propagate as a cyclically sinusoidal deformation on both surfaces and can be picked up by a Lamb wave receiver provided at a distance away on the same container wall, and can be converted back into an electrical signal, provided the Lamb waves can propagate without any impediment. If, on the other hand, the propagation of the Lamb waves is attenuated, which is the situation when the container contents reach a specific level in the region of the level measurement device, then the signal is nonexistent or is at least so heavily attenuated that it can be used as an indication of the level reached.

Based on the fact that Lamb waves are composed of shear waves or transverse waves oscillating at right angles to the surface and of compression or longitudinal waves oscillating tangentially, Lamb waves can be initiated in a plate or container wall of certain elasticity by means of ultrasound waves striking this plate or container wall obliquely.

According to one known method, these ultrasound waves which strike the plate or container wall obliquely can be produced with the aid of a prism or a prismatic molding, which is mounted on the plate and on whose incline a piezoelectric element is firmly arranged and is connected via electrodes to an AC voltage source. The Longitudinal wave (ultrasound wave) initiated in the piezoelectric element by an AC voltage pulse is transmitted through the prism to the plate, and strikes this plate a an angle which depends on the included angle 2 of the prism. The proportionality of the ratio of longitudinal waves and transverse waves to the resultant Lamb waves, and thus their amplitudes, is then also dependent on the included angle 2 of the prism. Waves of different orders can be excited depending on the thickness D of the plate or of the container wall and on the excitation frequency $\omega$, of which, however, only the zero order (zeroth mode) waves reach the surface and result in a deformation of the surfaces which propagates cyclically and sinusoidally and may be symmetrical or antisymmetrical with respect to the center plane. Zero order symmetrical Lamb waves are of particular importance for practical use, and these are referred to as the $s_0$ mode (zeroth symmetrical mode). (ULTRASONIC TECHNOLOGY, A Series of Monographs, General Editor Lewis Balamuth, Cavitron Corporation, New York, N.Y., RAYLEIGH AND LAMB WAVES, Physical Theory and Applications, I.A. Viktorov, pages 69, 70 and page 82 paragraph 3).

Special prisms are thus used in order to determine and/or to adjust the phase velocity of the relevant Lamb wave and the wavelength on the surface. Furthermore, in this method for Lamb wave excitation, the size or the dimension of the so-called excitation zone on the boundary surface between the prism and plate or container wall is important, and is governed by the projection of the area covered by the piezoelectric element on the incline of the prism onto the boundary surface between the prism and plate or container wall. The magnitude of the maxima of the excited Lamb waves is directly proportional to this excitation zone (page 84, paragraph 2, pages 87 to 88 loc. cit.).

An apparatus for level monitoring in a container, which makes use of this method, is described in DE 689 03 015 T2.

Another method uses the cyclic structures on the effective surface of a Lamb wave exciter resulting from piston vibration. In this case, compressions are produced at specific points on the plate or on the container wall, and their cyclic separation is governed by the phase velocity of the corresponding Lamb wave.

One problem in the excitation of Lamb waves in a plate or container wall by means of prisms is the impedance matching at the contact surfaces between the prism and the container wall, in which context it must be remembered that the containers whose level is intended to be monitored may be composed of widely differing materials, such as steel, brass, aluminum or else glass etc. When sudden impedance changes occur between the prisms of the Lamb wave exciter or Lamb wave receiver and the container wall, interference effects can occur in the form of parasitic waves or harmonics. The characteristics of the prisms, which are normally manufactured from plastic, preferably a polymer, may vary within wide limits, depending on the density, the concentration of the glass phase, the flow during pressing etc., so that the prisms must be specially matched to each application. Furthermore, certain characteristics of plastic prisms are dependent on temperature to an extent which cannot be ignored. Air holes which occur in the material during production of plastic prisms can undesirably influence the characteristics of the prism. From all this, it follows that production of plastic prisms is highly complex and costly.

One object of the invention is to provide a method for producing Lamb waves in a plate or container wall and an apparatus for carrying out this method, in which method there is no need for a prism and in which the phase velocity of the Lamb waves which are produced and the wavelength can be adjusted and matched easily, for example in an appropriate manner for different plate or container wall materials in which the Lamb waves are intended to propagate.

SUMMARY OF THE INVENTION

According to the present invention, this object is achieved in that an IDT transducer (interdigital transducer), which is known per se and comprises a layer composed of piezoelectric material and on one of whose surfaces two electrodes, which engage in one another like fingers, are applied, is coupled acoustically to the plate or container wall by the surface facing away from the electrodes, and a radio-frequency AC voltage is applied to the connections of the electrodes, which AC voltage causes cyclically occurring material compressions and rarefactions, so-called thickness vibration, in the piezoelectric layer between the electrode fingers, in which the speed of propagation or the speed of sound of the longitudinal waves resulting from this in the piezoelectric layer is matched to the phase velocity with which an $s_0$ mode Lamb wave propagates in the material of the plate or of the container wall, in that the distance D between the fingers of the electrodes is selected such that it is equal to half the wavelength $\lambda/2$ of the longitudinal wave to be initiated in the piezoelectric layer.

According to the novel method, no prism is required to excite Lamb waves in a plate or container wall, so that all the disadvantages associated with such prisms are also avoided, such as the material-related temperature dependency or negative influences caused by air holes that occur in the plastic during production of the prisms.

Owing to the relatively good match between the speed of propagation or speed of sound of the longitudinal waves in the piezoelectric layer and the phase velocity of the $s_0$ mode Lamb wave in the plate or container wall, the acoustic coupling between the piezoelectric layer and the plate or container wall produces only an $s_0$ mode Lamb wave in this plate or container wall after activation of the IDT transducer. Parasitic interference waves or harmonics are thus prevented.

The operating frequency of the IDT transducer as a Lamb wave exciter must be matched to the distance D between the electrode fingers and may thus also be varied, that is to say matched to different plate or container wall materials, without any need for changes to be made to the dimensions of the piezoelectric layer itself. Matching by varying the distance between the electrode fingers of an IDT transducer is considerably easier and more economic than by varying the included angle of the prism in the known prismatic Lamb wave exciters. In this case, the measured effectiveness of the IDT transducer as a Lamb wave exciter is comparable to that of the conventional Lamb wave exciters, in which a piezoelectric layer 's used to excite the Lamb waves on a polymer prism having a specific included angle.

The matching of the speed of propagation or speed of sound of the thickness vibration in the piezoelectric layer and of the longitudinal waves resulting from this to the phase velocity of the $s_0$ mode Lamb wave in the material of the plate or container wall by varying the distance D between the fingers of the electrodes of the IDT transducer can be carried out by FEM simulation (finite element method).

An apparatus for carrying out the invention comprises an IDT transducer (interdigital transducer) which is known per se and for its part comprises a piezoelectric layer on one of whose surfaces two electrodes, which engage in one another like fingers, are applied; the surface of this IDT transducer facing away from the electrodes is acoustically coupled to the plate or the container wall, and the connections of the electrodes are connected to a radio-frequency AC voltage source. The distance between the fingers of the two electrodes is in this case equal to half the wavelength $\lambda/2$ of the thickness vibration or longitudinal wave in the piezoelectric layer caused by the piezoelectric effect when the radio-frequency AC voltage is applied; the speed of propagation or speed of sound of the thickness vibration in the piezoelectric layer, and of the longitudinal waves resulting from this, is thus matched to the phase velocity of the $s_0$ mode Lamb wave in the material of the plate or of the container wall. A physically identical IDT transducer which is likewise acoustically coupled to the container wall and is at a distance from the IDT transducer which acts as the Lamb wave exciter receives the initiated Lamb waves and converts them back into an electrical signal.

According to a first embodiment of the present invention, the two electrodes of the IDT transducer have at least two electrode fingers, which engage in one another like fingers while maintaining the mutual separation D.

According to another embodiment of the present invention, the two electrodes of the IDT transducer have more than two electrode fingers, which engage in one another like fingers while maintaining the mutual separation D.

The piezoelectric layer of the IDT transducer is preferably composed of a piezoelectric ceramic material or of a piezoelectric composite material.

The construction, production and matching of the Lamb wave exciter according to the present invention are considerably simpler and more cost-effective than in the case of the known prismatic Lamb wave exciters.

The Lamb wave exciter according to the invention can be used in conjunction with a Lamb wave receiver constructed in the same way as a sensor for level measurement devices.

The present invention will be described in more detail in the following text with reference to the attached drawings, by way of example:

DETAILED DESCRIPTION OF THE PREFERRED EMBODIMENTS

Figure 5:
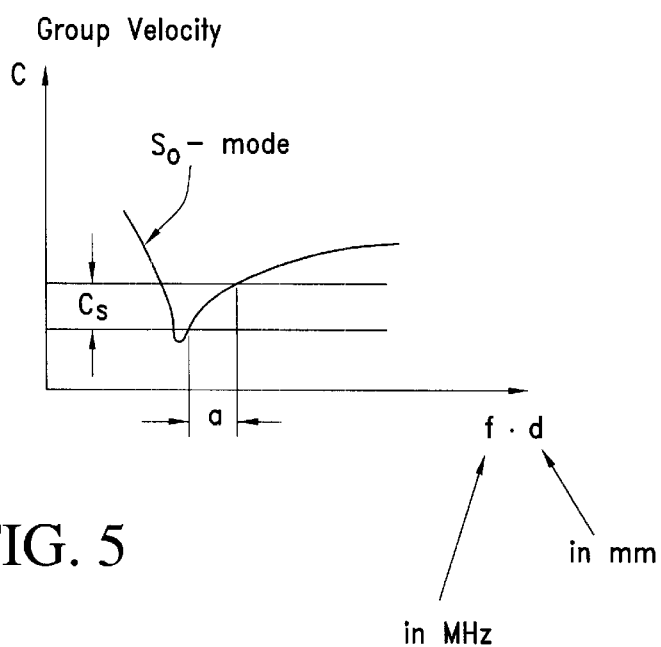

According to the present invention, the IDT structure, that is to say the structure of an interdigital transducer, is used to excite Lamb waves in a plate or container wall. As already mentioned, the $s_0$ mode of the Lamb waves is of primary importance for practical use. Specifically, the $s_0$ mode Lamb wave also has the best sensitivity with respect to a medium, or example a liquid, which comes into contact with one side of the plate or the inner surface of a container and attenuates the propagation of the Lamb waves depending on the filling level reached. Zero order Lamb waves ($s_0$ mode) pass through the entire plate or container wall and result in both surfaces of the plate or container wall being deformed with the deformation propagating cyclically and sinusoidally. In the presence of water, for example, a $s_0$ mode Lamb wave propagating in the plate or container wall is subject to an attenuation which is approximately 6 dB per 1 mm of plate or wall thickness over a constant frequency range of 2.5–5 MHz*mm and with a distance of 1 cm (between the Lamb wave exciter and the Lamb wave receiver). The attenuation of the so mode Lamb wave is thus particularly pronounced in comparison with that of other Lamb wave modes. The graph in FIG. 5 clearly shows the sensitivity on the snout-like profile of the group velocity c of the $s_0$ mode Lamb wave as a function of the operating frequency f times the wall thickness d of the container or of the plate in the desired operating range a and with the speed of sound $c_s$; the change is most strongly pronounced in this region. Furthermore, FIG. 5 shows that the operating frequency f of the excited $s_0$ mode Lamb waves and the wall thickness d of the container or of the plate depend on one another, and influence one another, that is to say a greater wall thickness d requires a lower operating frequency f for the $s_0$ mode Lamb wave.

The invention is based on the relatively good match between the phase velocity of the so mode Lamb wave in a material plate or container wall and the speed of propagation or the speed of sound of a longitudinal wave resulting from a thickness vibration in a layer composed of piezoelectric material, preferably a piezoelectric ceramic material.

The chase velocity of the $s_0$ mode Lamb wave is, for example 3000–4000 M/s in a steel plate; the speed of propagation or the speed of sound of a longitudinal wave in a layer composed of piezoelectric ceramic material is 3600–4000 m/s.

A longitudinal wave or thickness vibration which is initiated in a piezoelectric layer and has this speed of propagation or speed of sound will thus cause only an $s_0$ mode Lamb wave, due to the resonance effect, in this plate or container wall, provided there is good acoustic coupling between this piezoelectric layer and a steel plate or a steel container wall; interference effects due to parasitic waves or harmonics are thus precluded from the start.

Figure 1:
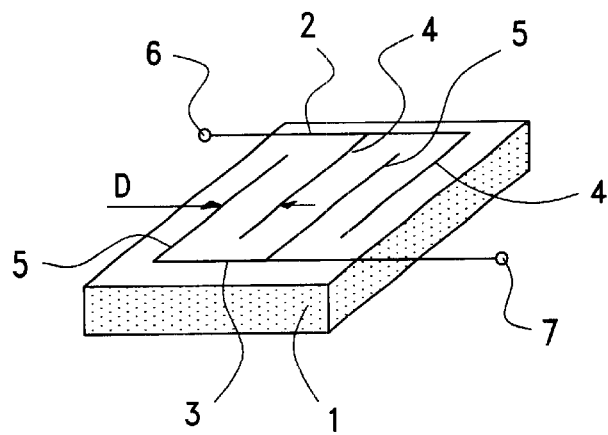
FIG. 1 is a perspective illustration of a first embodiment of a Lamb wave exciter according to the present invention, FIG. 2 likewise shows a perspective illustration of a second embodiment of a Lamb wave exciter according to the present invention.

FIG. 1 shows a first, simple form of a Lamb wave exciter according to the invention based on the IDT structure of an interdigital transducer. Two electrodes 2 and 3, which engage in one another like fingers, are applied on a layer 1 composed of piezoelectric material, with a constant distance D being maintained between the fingers 4 of the one electrode 2 and the fingers 5 of the other electrode 3. A ceramic or composite material is preferably used as the piezoelectric material for the layer 1. These materials have, inter alia, the advantage that the speed of sound is only slightly dependent on the temperature.

Figure 2:
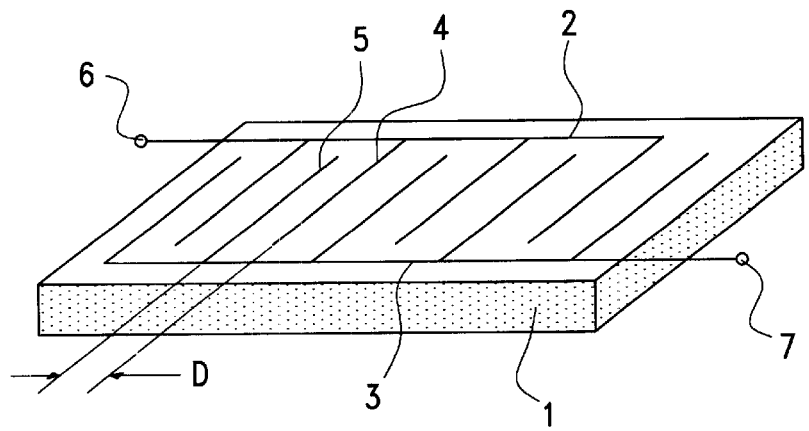

FIG. 2 shows an expanded embodiment of a Lamb wave exciter constructed on the basis of the same IDT structure, but which differs from that shown in FIG. 1 by the number n of fingers 4 and 5 of the two electrodes 2 and 3.

Figure 3:
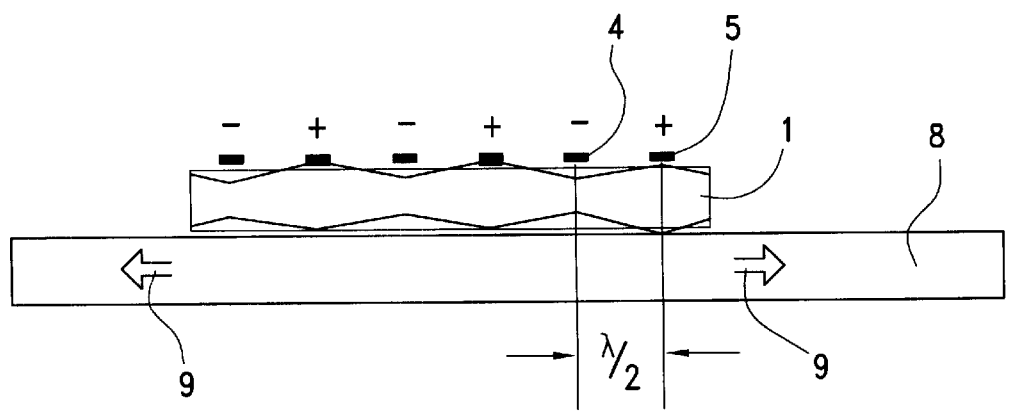
FIG. 3 shows, schematically, the excitation of Lamb waves by means of a Lamb wave exciter according to the present invention, and their propagation in a plate or container wall.

If an appropriate radio-frequency AC voltage is applied to the connections 6 and 7 of the electrodes 2 and 3, then a thickness vibration is initiated in the piezoelectric layer 1, and propagates as symmetrical surface waves along both surfaces of the layer 1, as is indicated in FIG. 3. As can likewise be seen from FIG. 3, the distance D between the fingers 4 and 5 of the electrodes 2 and 3 corresponds to half the wavelength $\lambda/2$ of the wave-like surface deformations which result from the thickness vibration of the piezoelectric layer 1, thus resulting in an $n*\lambda/2$-times thickness vibration of the layer 1, which lies in the region of the excitation resonance for the so mode Lamb wave to be excited in a plate 8 or container wall 8, where n is the number of fingers 4 and 5 of the electrodes 2 and 3.

Figure 4:
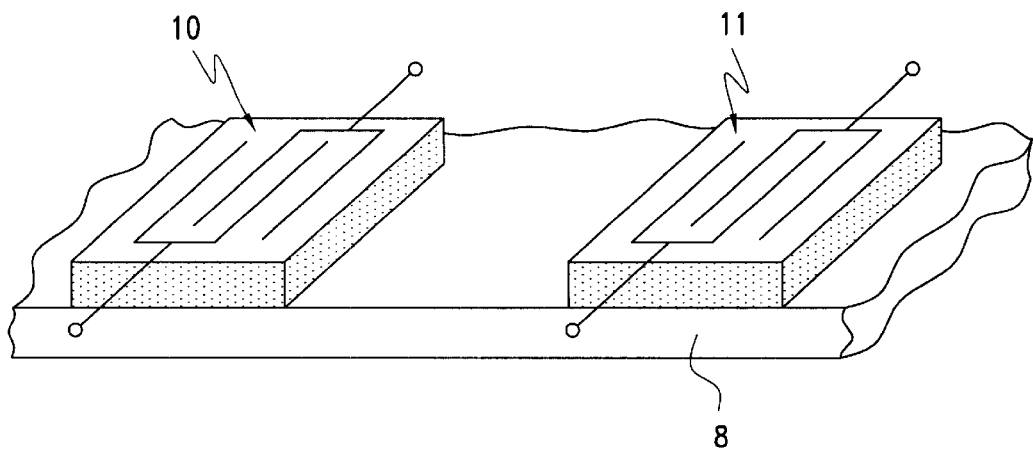
FIG. 4 shows an example of the use of a Lamb wave exciter as shown in FIG. 1 in conjunction with the Lamb wave receiver constructed in the same way, as a sensor for level measurement on a container wall, and FIG. 5 uses a graph to show the basic profile of the group velocity c of $s_0$ mode Lamb waves as a function of the operating frequency f times the wall thickness d of a plate or container wall.

Thus, in order to produce an so mode Lamb wave in a plate 8 or container wall 8, a Lamb wave exciter as shown in FIG. 1 or 2 is fitted parallel on this plate 8 or container wall 8 with good acoustic coupling. The AC voltage which is applied to the electrodes 2 and 3 via their connections 6 and 7 causes a thickness vibration in the piezoelectric layer 1 which, due to the acoustic coupling between the piezoelectric layer 1 and the plate 8 or container wall 8 is transmitted to the latter and thus, owing to the resonance conditions described above between the speed of propagation of the longitudinal waves in the piezoelectric layer and the phase velocity of the $s_0$ mode Lamb wave in a plate or container wall 8, produces an $s_0$ mode Lamb wave in this plate 8 or container wall 8, which then propagates in this plate 8 or container wall 8 as indicated by the arrows 9 in FIG. 3. A Lamb wave receiver 11, which is arranged on the container wall 8 at a distance from the Lamb wave exciter 10 and which, as shown in FIG. 4, is constructed as an IDT transducer in the same way as the Lamb wave exciter 10, can receive this $s_0$ mode Lamb wave, provided this Lamb wave can propagate without being attenuated, and can convert it back into an electrical signal. The $s_0$ mode Lamb wave is attenuated during its propagation by a medium which comes into contact with the rear face of the plate 8 or the inner surface of the container wall 8, so that the absence of the electrical signal at the Lamb wave receiver 11 can be used as an indication that a specific level has been reached in the region of the measurement arrangement.

Since, as mentioned, the wavelength $\lambda$ of the longitudinal waves in the piezoelectric layer 1 is determined directly, in the described method for producing an $s_0$ mode Lamb wave, by the distance D between the fingers 4 and 5 of the electrodes 2 and 3 of the IDT transducer, it is possible to match the operating frequency of the IDT transducer to the phase frequency of the $S_0$ mode Lamb wave in a specific material just by varying this distance D, and in this way to achieve the respectively best effectiveness for excitation of the Lamb wave, that is to say the method and the apparatus for carrying out the method can be used with containers of widely differing material, for example composed of steel, bronze, aluminum or else glass, without having to make any changes whatsoever to the dimensions of the piezoelectric layer 1 itself. The matching of the distance D between the fingers 4 and 5 of the electrodes 2 and 3 to the container material can be determined numerically using the FEM simulation (finite element method). The measured effectiveness of the IDT Lamb wave exciter is comparable to that of the conventional Lamb wave exciters, which use a piezoelectric element in conjunction with a (polymer) plastic prism having a specific included angle. Since, according to the invention, there is no need for a prism, this also avoids the disadvantages associated with such a prism, which were described initially.

What is claimed is:

1. A method for exciting Lamb waves in a plate using an IDT (interdigital transducer) having a layer of piezoelectric material on one of whose surfaces two electrodes are mounted which engage in one another like fingers, the IDT being coupled acoustically to the plate by the other of the surfaces of the layer, the method comprising the steps of:

applying a radio-frequency AC voltage to the electrodes causing cyclically occurring material compressions and rarefactions, a so-called thickness vibration, in the piezoelectric layer between the electrode fingers resulting in the propagation of longitudinal waves;

matching the speed of propagation or speed of sound of the longitudinal waves with the phase velocity with which an $s_0$ mode Lamb wave propagates in the material of the plate; and selecting the distance between fingers of the electrodes such that it is equal to half the wavelength $\lambda/2$ of the longitudinal wave initiated in the piezoelectric layer.

2. The method as defined in claim 1, wherein said matching is carried out by varying the distance D by means of FEM (finite element method) simulation.

3. An apparatus for excitation of Lamb waves in a plate and for receiving the Lamb waves, comprising:

a piezoelectric layer having two surfaces, on one of said two surfaces are mounted two electrodes which engage one other like fingers, and the other of said two surfaces acoustically couples said piezoelectric layer to the plate;

a radio-frequency AC voltage source connected to said two electrodes; and an identical piezoelectric layer also coupled in the same way to said plate at a distance from said piezoelectric layer for receiving the initiated Lamb waves, wherein:

the distance between the fingers of the two electrodes is equal to half the wavelength $\lambda/2$ of the thickness vibration in said piezoelectric layer, said thickness vibration being caused by the piezoelectric effect when the radio-frequency AC voltage from said radio-frequency AC voltage source is applied, and the speed of propagation or the speed of sound of the longitudinal waves which result from the thickness vibration is matched to the phase velocity of an $s_0$ mode Lamb wave in the material of the plate.

4. The apparatus as defined in claim 3, wherein each electrode has at least two fingers which engage in one another like fingers while maintaining said distance.

5. The apparatus as defined in claim 3, wherein each electrode has more than two fingers which engage in one another like fingers while maintaining said distance.

6. The apparatus as defined in claim 3, wherein said piezoelectric layer is composed of piezoelectric ceramic material.

7. The apparatus as defined in claim 3, wherein said piezoelectric layer is composed of a piezoelectric composite material.

* * * * *